United States Patent [19]

Uzunoglu

[11] 4,356,456
[45] Oct. 26, 1982

[54] DIVISION BY NONINTEGER NUMBERS USING SYNCHRONOUS OSCILLATORS

[75] Inventor: Vasil Uzunoglu, Ellicott City, Md.

[73] Assignee: Communications Satellite Corporation, Washington, D.C.

[21] Appl. No.: 171,074

[22] Filed: Jul. 22, 1980

[51] Int. Cl.³ .......................... H03B 5/12; H03L 7/00
[52] U.S. Cl. ........................... 331/117 R; 307/220 R;
                                   331/172; 363/163; 363/173
[58] Field of Search ................. 331/51, 53, 55, 117 R,
            331/117 FE, 172, 173; 363/157, 163, 173;
            328/15, 25, 30, 39; 307/220 R, 220 C, 225 R,
                                                        225 C

[56] References Cited

U.S. PATENT DOCUMENTS

| | | | |
|---|---|---|---|
| 2,572,698 | 10/1951 | Canfora | 331/51 |
| 3,181,070 | 4/1965 | Robuck | 331/51 X |
| 3,316,478 | 4/1967 | Palaniecki | 307/220 R X |
| 3,353,104 | 11/1967 | Loposer | 328/39 |
| 3,369,194 | 2/1968 | Anderson | 331/113 |
| 3,478,225 | 11/1969 | Bryant | 331/173 X |
| 3,605,023 | 9/1971 | Kline, Jr. | 328/25 |
| 3,716,794 | 2/1973 | Teggatz et al. | 328/39 |
| 3,925,734 | 12/1975 | Smith | 331/41 |
| 4,041,403 | 8/1977 | Chiapparoli, Jr. | 328/39 |

Primary Examiner—Siegfried H. Grimm
Attorney, Agent, or Firm—Sughrue, Mion, Zinn, Macpeak & Seas

[57] ABSTRACT

A synchronous oscillator is provided to divide the frequency of an input signal by a noninteger number, the noninteger number being expressed as the ratio of two whole integers X/Y. The oscillator is tuned to the desired output frequency, whereby every Yth cycle of the output signal is synchronized by every Xth cycle of the input signal at the negative (and possibly positive) peak of the output signal, thereby effecting a simultaneous multiplication and division of the input frequency of Y and X respectively. A pulse forming network provides the input signal in the form of pulses, whereby synchronization is effected at precise points in time. Pulse width and amplitude are adjustable to vary the input signal energy.

25 Claims, 6 Drawing Figures

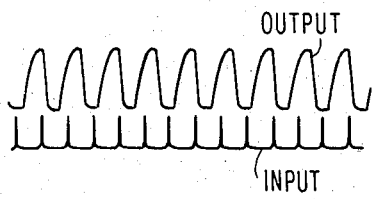
FIG. 2 — DIVISION BY 3/2
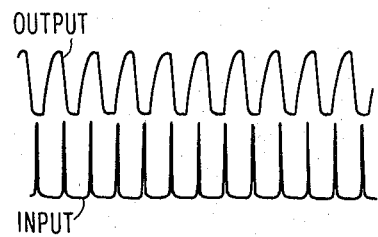
FIG. 3 — DIVISION BY 4/3
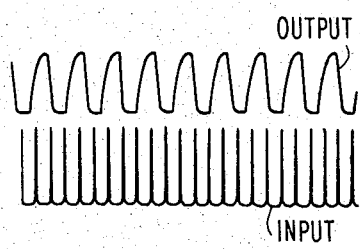
FIG. 4 — DIVISION BY 5/2
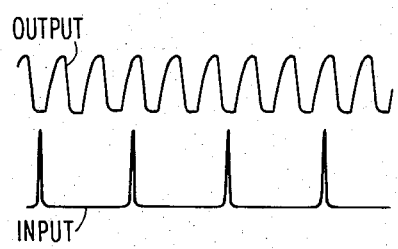
FIG. 5 — DIVISION BY 2/5
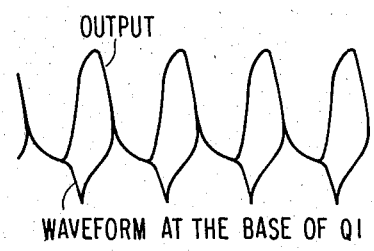
FIG. 6 — PRINCIPLE OF SYNCHRONIZATION

DIVISION BY NONINTEGER NUMBERS USING SYNCHRONOUS OSCILLATORS

BACKGROUND OF THE INVENTION

It is well known that frequency division and multiplication by integer numbers may be accomplished using synchronous oscillators. One such technique is described in U.S. Pat. No. 3,369,194. Another circuit which performs a division operation, as well as recovering a carrier signal, is described in co-pending U.S. patent application Ser. No. 153,289, entitles "Carrier Recovery Network for QPSK Modems Employing Synchronous Oscillators", by Vasil Uzunoglu, the entire disclosure of which is hereby incorporated by reference.

Neither analysis, technical literature, nor documents concerning the division and multiplication of frequencies by noninteger numbers using synchronous oscillators are presently available.

Division by noninteger numbers can be accomplished with several commonly used digital techniques such as disclosed in U.S. Pat. Nos. 3,716,794, 3,353,104, and 4,041,403, for example. Division by 3/2, for example, can be performed by multiplying the original frequency $f_1$ by 2, and dividing the result by 3. This procedure first necessitates a doubling of the frequency $f_1$, and secondly requires a division of the result by 3 using a divide-by-3 counter. This process involves two tasks and the result may suffer from several major drawbacks. First, under noisy conditions, the divide-by-3 network, especially at high frequencies, may skip counts. Secondly, counters over 100 MHz become less dependable. Thirdly, there are no counters presently available above 200 MHz. Finally, the above mentioned process of multiplication introduces high levels of harmonics into the system.

SUMMARY OF THE PRESENT INVENTION

The present invention avoids the above mentioned difficulties encountered by the prior art noninteger division techniques by employing a synchronous oscillator as the frequency dividing network.

Briefly, the signal at the frequency to be divided is applied to a pulse forming network to provide narrow spikes to the input of a synchronous oscillator. The synchronous oscillator is tuned to the desired output frequency, the relationship between the input and output frequencies being a noninteger ratio. As long as the noninteger number is a quotient having whole integers as the numerator and denominator, the input and output waveforms will have at least one coincident synchronization point over a given time span, and synchronization between the input and output waveforms occurs at the lower (and possibly upper) peaks of the oscillator output waveform.

BRIEF DESCRIPTION OF THE DRAWINGS

FIGS. 2 through 6 are illustrations of the input and output waveforms as applied to and derived from the synchronous oscillator circuitry in accordance with the present invention.

DETAILED DESCRIPTION OF THE INVENTION

Figure 1:
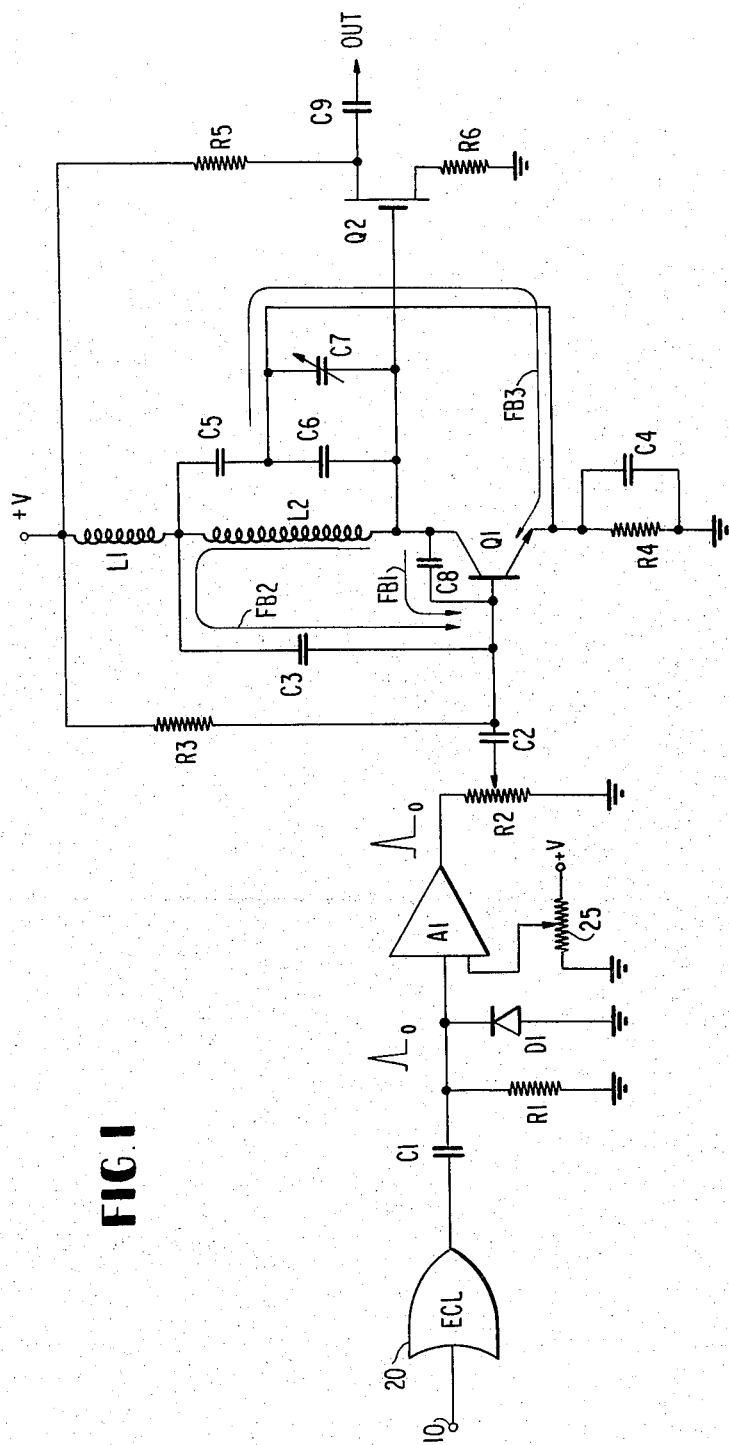
FIG. 1 is a schematic illustration of the synchronous oscillator circuitry in accordance with the present invention.

FIG. 1 is a schematic illustration of the dividing circuitry in accordance with the present invention. An input signal comprising recovered data in baud or bit rate from ECL logic 20 is applied to a differentiating circuit comprising capacitor C1 and resistor R1 where the input signal is converted to narrow pulses with a finite rise time such as those illustrated in FIGS. 2-5. Diode D1 is provided for bypassing the negative going pulses. The narrow pulses are applied to the input of the threshold amplifier A1 which may comprise a simple transistor operating in a saturated mode. The amplifier or transistor A1 accepts the narrow pulses and amplifies them to a minimum of three volts. A reference voltage is applied from reference voltage source 25 to the amplifier so that the amplifier A1 operates above a preselected noise threshold level.

The output of amplifier A1 is fed to a synchronous oscillator similar to the one identified in the above mentioned U.S. patent application Ser. No. 153,289. Reference again is made to the above identified U.S. Patent Application for the theory of the synchronous oscillator operation and the analysis of a generalized synchronous oscillator. While the referenced analysis and theory of operation holds equally well for the present invention and the referenced invention, the critical differences between the present circuit and the referenced circuit will be discussed below.

The input pulses are applied to the base of transistor Q1 via potentiometer R2 and capacitor C2. The transistor Q1 has a positive source voltage applied to its collector through a pair of series-connected inductors L1 and L2. Transistor Q1 is further provided with a first collector-base feedback path FB1 through capacitor C8, a second feedback path FB2 from the node common to inductors L1 and L2 to the base of transistor Q1 through capacitor C3. Capacitors C5 and C6 are series-coupled from the collector of transistor Q1 to the node common to inductors L1 and L2. A third feedback path FB3 is established from the node common to capacitors C5 and C6 to the emitter of transistor Q1. A variable capacitor C7 is coupled across capacitor C6. Biasing resistor R3 is provided from the positive source voltage supply to the node common to transistor Q1 and capacitor C2. An emitter leg resistor R4 is provided from the emitter of transistor Q1 to ground, capacitor C4 being coupled across resistor R4. The collector output from transistor Q1 is applied to the gate of MOSFET Q2, while resistor R5 couples the source of Q2 to the positive supply. The drain of Q2 is applied to ground through optional resistor R6. The system output is taken from the source of Q2 via capacitor C9.

The critical differences between the synchronous oscillator of the present invention and that of co-pending Application Ser. No. 153,289 are as follows. The value of inductor L1 is chosen to be high (over 1 mh) in order to force more positive feedback through the feedback capacitor C3 than in the synchronous oscillator of the co-pending application. Conversely, the value of capacitor C3 is made as small as possible to permit a sufficient amount of feedback to establish regeneration. Capacitor C8 is added to provide some degree of integration so that the rise time of the narrow pulses is finite.

In operation, the inductor L2, in combination with capacitors C5, C6 and C7 constitutes the tuned circuit, the resonant frequency being selected to equal the desired output frequency. Emitter leg resistor R4 is provided for the generation of feedback, the capacitor C4 being provided to reduce the negative feedback across resistor R4 so that the AC output increases. MOSFET Q2 provides a buffer stage to reduce the external affects on the output oscillations.

The frequency dividing circuitry in accordance with the present invention has unique operational characteristics. The effective Q of the system is determined not only by the tuned circuit but is also determined by the input level of the pulse and by the pulse width. For a given tracking range for example, a decrease in the input level should be accompanied by an increase in the pulse width in order to maintain a substantially constant input energy level.

In the synchronous oscillator in accordance with the present invention, synchronization occurs only at the upper or lower peaks of the oscillator output waveform. Thus, the input pulses must be kept narrow in order to provide a precise point of synchronization, to avoid distortion of the output waveform, and to keep amplitude variations to a minimum. Therefore, the input pulse is differentiated by capacitor C1 and resistor R1. With reference to FIG. 6, it can be seen that a wider input pulse widens the areas where synchronization can occur, and the oscillator waveform is highly distorted. The voltage waveform at the base of the oscillator transistor encircles the collector voltage waveform around its negative peak. The peak base voltage which extends upward to the left is a function of the input voltage level. A reduction of the input or injection level reduces the peak level of the base voltage which encircles the output waveform. FIG. 6 indicates that the synchronization occurs when the collector voltage approaches a minimum, at which point the collector-base capacitance becomes a maximum, which suggests that a parametric phenomenon is taking place.

In the division of a frequency by the ratio X/Y, the denominator Y of the quotient corresponds to the number of cycles of the output waveform within a given time span, whereas the numerator X corresponds to the number of input control pulses within the same time span. Therefore, at least at one point within the selected time span, the input pulses and the output waveform can become synchronized. Since the input pulses are maintained at a very narrow pulse width, the point of synchronization can be maintained to a high degree of accuracy and distortions in the output waveform can be held to a minimum.

The process of division is better illustrated with reference to FIGS. 2, 3, 4 and 5. With reference to FIG. 2, it can be seen that every third input pulse in the divide by 3/2 network affects every second waveform of the oscillator output frequency, the point of synchronization easily being seen. Therefore, every third input pulse synchronizes every second oscillator waveform, resulting in a simultaneous multiplication by 2 and division by 3. In FIG. 3, every fourth input pulse synchronizes every third oscillator waveform, resulting in a division by 4/3, in FIG. 4, every fifth input pulse synchronizes every second oscillator waveform resulting in a division by 5/2, and in FIG. 5 every second input pulse synchronizes every fifth oscillator waveform.

The phase area at which synchronization can occur is located in the area of the negative (and possibly positive) peaks of the oscillator output waveform, the synchronization pulses outside this phase area being ineffective. This phase area is usually much less than 90° as can be seen in FIG. 4, for example. Thus, the possibility of achieving synchronization over a given number of oscillator output waveforms is directly proportional to the number of synchronization pulses between the given number of output waveforms. Specifically, in FIG. 4, where a large number of synchronizing pulses are present to provide synchronization, a larger number of the synchronization pulses are likely to fall within the phase area to provide synchronization compared to FIG. 5 where a smaller number of pulses are present. Therefore, for a given output frequency, synchronization is more easily achieved as larger non-integer quotients are employed, i.e. 5/2 versus 2/5. The fact that synchronization may occur for pulses not exactly corresponding to the non-integer quotient due to the finite phase area (i.e. the fourth input pulse synchronizing the second oscillator waveform in a 5/2 division) is of no consequence since synchronization will also occur at the exact point (i.e. fifth pulse) as well. This additional synchronization prevents oscillator drift and results in highly stable operation even in burst mode.

In the present circuit design a balance between high and low Q operation must be maintained. Especially in circuits having low driving energy, i.e. where a relatively small number of input pulses are available to synchronize the output waveform, the circuit Q must be kept sufficiently low, and the bandwidth sufficient wide, or synchronization may be lost from time to time. The input pulse width and voltage level may be varied at differentiator C1, R1 and potentiometer R2 in order to vary the energy of the input pulses, since the bandwidth of the oscillator is a function of the energy of the input pulses, as more fully detailed in Ser. No. 153,289. On the other hand, when used in burst mode applications, it is important to minimize acquisition time. Since the acquisition time depends on the "distance" between the initial input and output frequencies, high Q operator rapidly provides a precise output frequency so that synchronization may be accomplished in a minimum amount of time. Given the above parameters, and the present and referenced disclosures, it will become apparent to those skilled in the art that a wide variety of circuits may be designed in order to maximize the operational characteristics of the divider for particular applications.

The following approximate component values are given below as an example of a divide-by-4/3 circuit operating at a 30 MHz output frequency:

$R2 = 1K\Omega$
$R3 = 75K\Omega$
$R4 = 360\Omega$
$R5 = 1K$
$R6 = 100\Omega$
$C2 = 100pf$
$C3 = 500pf$
$C4 = 6pf$
$C5 = 15pf$
$C6 = 15pf$
$C7 = 0-9pf$
$C8 = 7pf$
$C9 = 100pf$
$L1 = 10mh$
$L2 = 1.5-3 \mu h$
$Q1 = MPS6515$
$Q2 = SD201$ Operational tests have been performed on a synchronous oscillator tuned to 0.8 MHz with input driving pulse rates of 1.2, 1.064, and 2.0 MHz to provide divide-by 3/2, 4/3, and 5/2 circuits, respectively. In the 3/2 divider circuit, the tracking range was limited to approximately ±12 KHz. The short term stability of the synchronous oscillator is confined to less then 43 Hz per 7 seconds, while the long term stability was confined to less then 600 Hz in two hours. The tracking range for divide-by 4/3 and 5/2 networks was confined to approximately ±8 KHz.

The noninteger dividing network in accordance with the present invention utilizes a new technique in the field of electronic counting and division. As the division is performed directly through a synchronization system, fewer elements are used and the output waveform contains fewer harmonics. Moreover, the divider in accordance with the present invention is useful especially at frequencies over 100 MHz where presently available counters are limited. Further, under noisy conditions, the present technique of division is more effective than prior art counting circuits.

While the experiments discussed herein were performed at 800 KHz with inputs of 1.2 MHz, 1.064 MHz and 2 MHz provide division by 3/2, 4/3 and 5/2, respectively, the present invention has no limitations in frequency and may be used in the present mode up to approximately 500 MHz. The same concept also holds for division in the microwave frequency region by use of appropriate microwave circuits. In fact, the circuit design at microwave frequencies is simplified by the fact that a synchronous oscillation and a high Q may be achieved more easily with microwave elements as opposed to lumped circuit elements. For a detailed discussion of the application of a synchronous oscillator to microwave frequencies, reference is made to "Injection Locking of Microwave Solid State Oscillators", by K. Kurokawa, in *Proceedings of the IEEE*, Vol. 61, No. 10, Oct. 1973, pp. 1386–1408; and "Microwave Solid State Injection Locked Amplifiers", by W. R. Day, G. E. Lindgren and C. C. Peterson, in *Microwave Journal*, May 1976, p. 59, the teachings of which are hereby incorporated by reference.

The present technique applies equally to division by all quotients which have whole numbers in both the numerator and denominator and which are limited only by harmonic and sub-harmonic tracking capability of the synchronous oscillator.

Various changes, additions and omissions of elements may be made within the scope and spirit of this invention. It is to be understood that the invention is not limited to specific details, examples and preferred embodiments shown and described herein.

I claim:

1. An apparatus for dividing the frequency of a signal at a first frequency by a non-integer number comprising:
   a synchronous oscillator including a transistor having an input and an output, said signal at said first frequency being applied to said input;
   at least one transistor feedback path synchronizing said transistor input to said transistor output; and
   a tuned circuit coupled to at least a portion of said transistor feedback path to thereby provide said transistor with an output at a second frequency, the ratio of said first frequency to said second frequency being substantially equal to a non-integer value wherein said non-integer value is expressed as the ratio of two integers, X/Y, X and Y being integers; and
   said synchronous oscillator synchronizes every Yth cycle of said transistor output with every Xth cycle of said transistor input thereby effecting a simultaneous multiplication and division of said input frequency by Y and X respectively.

2. The apparatus of claim 1 wherein said tuned circuit comprises a first reactive impedance means, a second reactive impedance means coupled across said first reactive impedance means and having a reactance opposite to said first reactive impedance means, said first and second reactive impedance means being coupled to transistor at said output.

3. The apparatus of claim 2 wherein said transistor has a control electrode and two main electrodes, said input being at said control electrode, said output being at one of said two main electrodes, and said at least one transistor feedback path is from said second reactive impedance means to the other of said two main electrodes.

4. The apparatus of claim 2 wherein said transistor has a control electrode and two main electrodes, said input being at said control electrode, said output being at one of said two main electrodes, and said at least one transistor feedback path is from a node common to said first and second reactive impedance means through a third reactive impedance means to said control electrode.

5. The apparatus of claim 4 wherein said third reactive impedance means is a capacitor.

6. The apparatus of claim 2 wherein said transistor has a control electrode and two main electrodes, said input being at said control electrode, said output being at one of said two main electrodes, and said at least one transistor feedback path is from said second reactive impedance means to the other of said two main electrodes, a second transistor feedback path is from a first node common to said first and second reactive impedance means through a third reactive impedance means to said control electrode, and a third transistor feedback path is from a second node common to said first and second reactive impedance means through a fourth reactive impedance means to said control electrode.

7. The apparatus of claim 6 wherein said third and fourth reactive impedance means are respective capacitors.

8. The apparatus of any one of claims 2–7 wherein said first reactive impedance means comprises an inductor (L2) and said second reactive impedance means comprises a pair of capacitors (C5, C6).

9. The apparatus of claim 4 wherein said third reactive impedance means is a capacitor having low capacitance so as to establish signal regeneration at said transistor.

10. The apparatus of claim 6 wherein said third reactive impedance means is a capacitor having low capacitance so as to establish signal regeneration at said transistor.

11. The apparatus of claim 2 wherein a supply voltage is coupled to said transistor output by way of a series connection of (i) said tuned circuit and (ii) an additional reactive impedance means (L1).

12. The apparatus of claim 11 wherein said additional reactive impedance means comprises an inductor having an inductance over 1 mh.

13. The apparatus of any one of claims 1–7 or 9–12 further comprising pulse-forming means for delivering said signal at said first frequency to said transistor input in the form of pulses.

14. The apparatus of claim 13 wherein said pulse-forming means comprises means for adjusting the energy level of said pulses.

15. The apparatus of claim 14 wherein said pulse forming means comprises means for differentiating an input signal to provide a differentiated signal, means for passing selecting portions of said differentiated signal to provide a passed signal, and means for adjusting the amplitude of said passed signal to provide said signal at said first frequency.

16. The apparatus of claim 15 wherein means for differentiating comprises an RC circuit.

17. The apparatus of claim 16 wherein said means for passing comprises a diode, whereby said passed signal is unipolar.

18. The apparatus of claim 17 wherein said means for adjusting the amplitude comprises an amplifier having an adjustable threshold and a potentiometer.

19. A frequency dividing circuit for dividing the frequency of an input signal by a non-integer number to produce a steady-state output signal comprising:
a single synchronous oscillator receiving said input signal and providing said steady-state output signal in accordance with said non-integer number wherein said non-integer number is expressed as the ratio of two integers, X/Y, X and Y being integers; and
said synchronous oscillator synchronizes every Yth cycle of said output signal with every Xth cycle of said input signal thereby effecting a simultaneous multiplication and division of said input frequency by Y and X respectively.

20. The circuit of claim 19 wherein said input signal is at a frequency range above which ditigal elements can function.

21. The circuit of claim 19 wherein said input signal is at a frequency above 200 MHz.

22. The circuit of claim 20 wherein said input signal is in the microwave region.

23. The circuit of claim 19 further comprising a pulse forming network for providing said input signal, said pulse forming network providing means to adjust the energy of said input signal.

24. A method for dividing the frequency of an input signal by a non-integer number X/Y, X and Y being integers, to provide an output signal, the method comprising:
applying said input signal to synchronous oscillator means; and
synchronizing every Yth cycle of the output signal of said synchronous oscillator means with every Xth cycle of said input signal, thereby effectively simultaneously multiplying the frequency of said input signal by Y and dividing the frequency of said input signal by X at said synchronous oscillator means to produce said output signal.

25. The method of claim 24 wherein said step of simultaneously multiplying and dividing comprises synchronizing every Yth cycle of said output signal with every Xth cycle of said input signal.

* * * * *